United States Patent
Lin

(10) Patent No.: US 7,189,586 B2
(45) Date of Patent: Mar. 13, 2007

(54) TEST KEY FOR MONITORING GATE CONDUCTOR TO DEEP TRENCH MISALIGNMENT

(75) Inventor: Yu-Chang Lin, Yun-Lin Hsien (TW)

(73) Assignee: Nanya Technology Corp., Teo-Yuan Hsien (TW)

( * ) Notice: Subject to any disclaimer, the term of this patent is extended or adjusted under 35 U.S.C. 154(b) by 354 days.

(21) Appl. No.: 10/904,652

(22) Filed: Nov. 21, 2004

(65) Prior Publication Data

US 2005/0269567 A1    Dec. 8, 2005

(30) Foreign Application Priority Data

Jun. 4, 2004    (TW) ............... 93116162 A

(51) Int. Cl.
*H01L 21/66* (2006.01)
*H01L 23/58* (2006.01)

(52) U.S. Cl. ............. 438/17; 438/18; 257/48; 257/905; 257/908; 257/E23.179

(58) Field of Classification Search ............. 257/48, 257/905–908, E23.179; 438/17, 18
See application file for complete search history.

(56) References Cited

U.S. PATENT DOCUMENTS

| 6,617,180 | B1 * | 9/2003 | Wang ..................... 438/18 |
| 6,801,462 | B2 * | 10/2004 | Chang et al. ............. 365/201 |
| 2005/0040398 | A1 * | 2/2005 | Kowalski et al. ......... 257/48 |

* cited by examiner

*Primary Examiner*—Kenneth Parker
*Assistant Examiner*—Matthew E. Warren
(74) *Attorney, Agent, or Firm*—Winston Hsu

(57) ABSTRACT

A test key for monitoring GC-DT misalignment is provided. Deep trench capacitors are embedded in an interlacing matrix manner. GC lines are defined on a substrate and passing over the deep trench capacitors. A first bit line contact pattern surrounded by first assistant bit line contact patterns is disposed on the right side of a first deep trench capacitor. A second bit line contact pattern surrounded by second assistant bit line contact patterns is disposed on the left side of a second deep trench capacitor. The test key has a mirror symmetric line. The first assistant bit line contact patterns and second assistant bit line contact patterns are symmetric with respect to the mirror symmetric line. An active area connects the first bit line contact pattern and the second bit line contact pattern. A signal-in bit line is connected to the first bit line contact and a signal-out bit line is connected to the second bit line contact. The rest rows of the bit lines are dummy bit lines and floating.

7 Claims, 6 Drawing Sheets

TEST KEY FOR MONITORING GATE CONDUCTOR TO DEEP TRENCH MISALIGNMENT

BACKGROUND OF INVENTION

1. Field of the Invention

The present invention relates to a test key structure, and more particularly, to a test key for monitoring gate conductor-deep trench (GC-DT) misalignment in the fabrication of deep-trench dynamic random access memories (DRAMs).

2. Description of the Prior Art

In semiconductor fabrication, a semiconductor device or an integrated circuit (IC) is continuously tested in every step so as to maintain the quality of the IC. Ordinarily, a testing circuit is simultaneously fabricated with an actual device so that the quality of the actual device can be assessed by the performance of the testing circuit. The quality of the actual device therefore can be well controlled. Typically, such testing circuit, which is also referred to as "test key", is disposed on a peripheral area of each chip or die.

A typical method to test a wafer is called a wafer acceptance testing (WAT) method, which can measure defects of the wafer. The WAT method includes providing several test keys distributed in the periphery region of a die. The test keys typically are formed on a scribe line between dies, and are electrically coupled to an external terminal through a metal pad. A module of the test keys is selected and each test key off the selected module is respectively used for a test of different property of the wafer, such as threshold voltage ($V_{TH}$) or saturate current $I_{DSAT}$. A controlled bias is applied to the test keys, and the induced current is read out to detect defects on the wafer.

As known in the art, in trench DRAM fabrication, the process window for gate conductor-deep trench (GC-DT) misalignment is small. There is a strong need to provide an effective test key structure for monitoring the GC-DT misalignment during the fabrication of trench capacitor DRAMs, especially for the DRAM process using 90 nm line width standard.

SUMMARY OF INVENTION

The primary object of the present invention is to provide a test key structure for monitoring the GC-DT misalignment during the fabrication of trench capacitor DRAM device that has trench capacitors arranged in an interlacing matrix manner and is fabricated using 90 nm process.

According to the claimed invention, a test key structure for monitoring Gate Conductor-to-Deep Trench capacitor (GC-DT) misalignment is provided. The test key structure includes a substrate; a plurality of trench capacitors embedded in the substrate in an interlacing matrix manner; columns of gate conductor (GC) lines defined on the substrate and passing over the trench capacitors; a first bit line contact, surrounded by first assistant bit line contacts, wherein the first bit line contact is disposed on a right side of a first trench capacitor; a second bit line contact surrounded by second assistant bit line contacts, wherein the second bit line contact is disposed on a left side of a second deep trench capacitor; an active area situated in the substrate and the active area being electrically connected to the first and second bit line contacts; and rows of bit lines including a signal-in bit line connected to the first bit line contact, a signal-out bit line connected to the second bit line contact, and a plurality of floating dummy bit lines overlying the corresponding first and second assistant bit line contacts.

The test key structure has a mirror symmetric line such that the first assistant bit line contacts and the second assistant bit line contacts are symmetric with respect to the mirror symmetric line, while the plurality of trench capacitors are asymmetric with respect to the mirror symmetric line.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
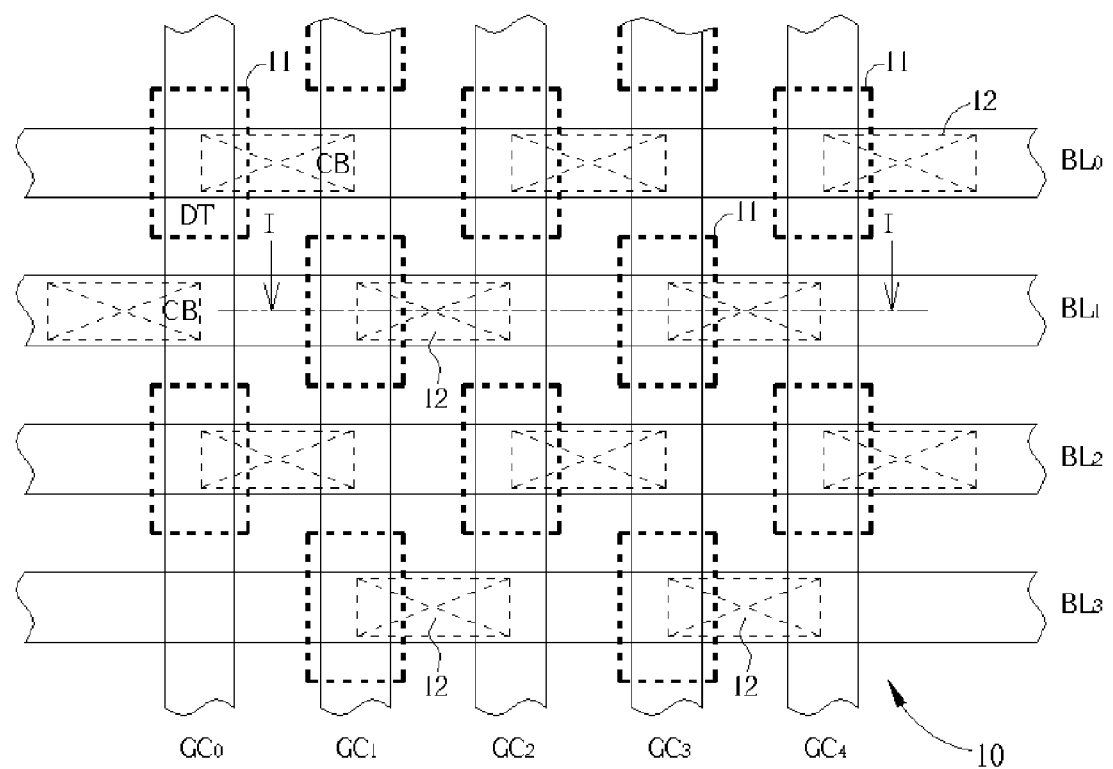
FIG. 1 is a plan view showing a portion of the layout of a trench capacitor DRAM array.
Figure 2:
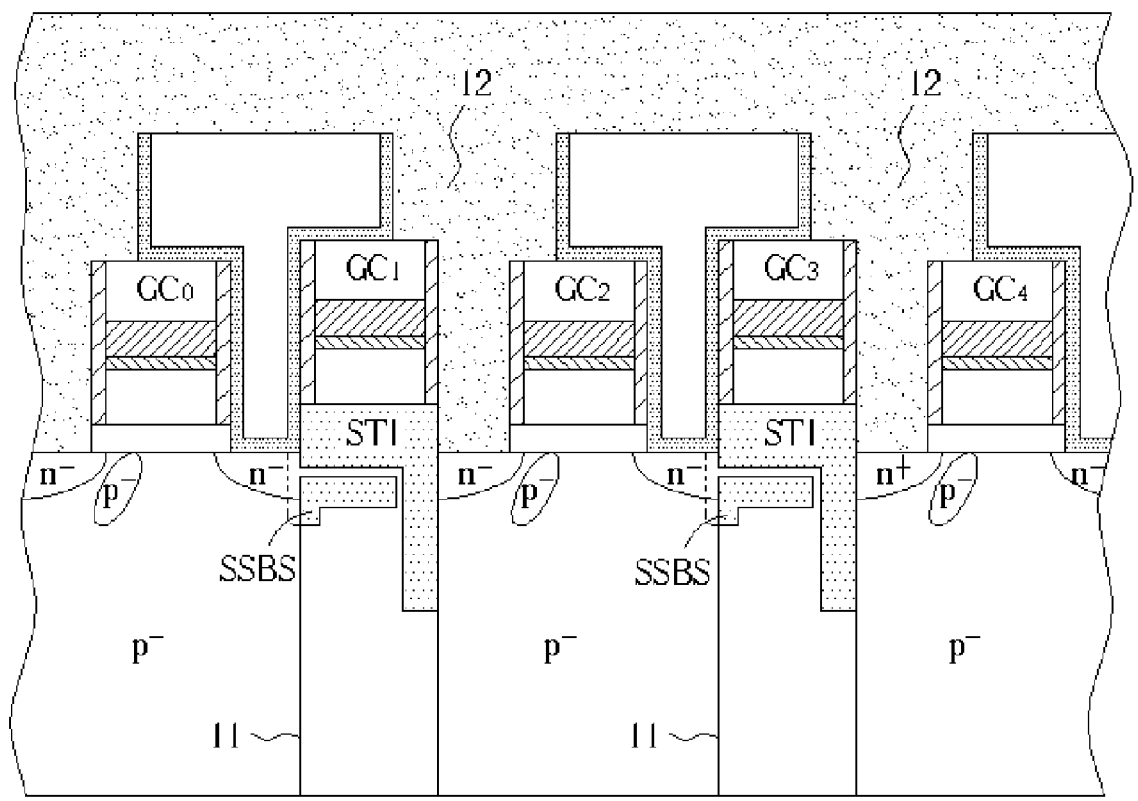
FIG. 2 is a schematic cross-sectional diagram along line I—I of FIG. 1.

Please refer to FIG. 1 and FIG. 2. FIG. 1 is a plan view showing a portion of the layout 10 of a trench capacitor DRAM array. FIG. 2 is a schematic cross-sectional diagram along line I—I of FIG. 1. The present invention is suitable for the trench capacitor DRAM devices fabricated with standard 90-nanometer process. As shown in FIG. 1, the deep trench capacitors (hereinafter referred to as "DT") 11 are arranged in an interlacing matrix manner. The gate conductor lines (hereinafter referred to as "GC") including $GC_0$, $GC_1$, $GC_2$, $GC_3$, and $GC_4$, are orthogonal to the overlying bit lines $BL_0$, $BL_1$, $BL_2$, $BL_3$. The 90 nm scale trench capacitor DRAM cell is characterized in that each cell has a single side buried strap (as indicated with "SSBS" in FIG. 2). Each bit line is electrically connected to a source/drain region of corresponding cell select transistor through a bit line contact (hereinafter referred to as "CB") 12.

Figure 3:
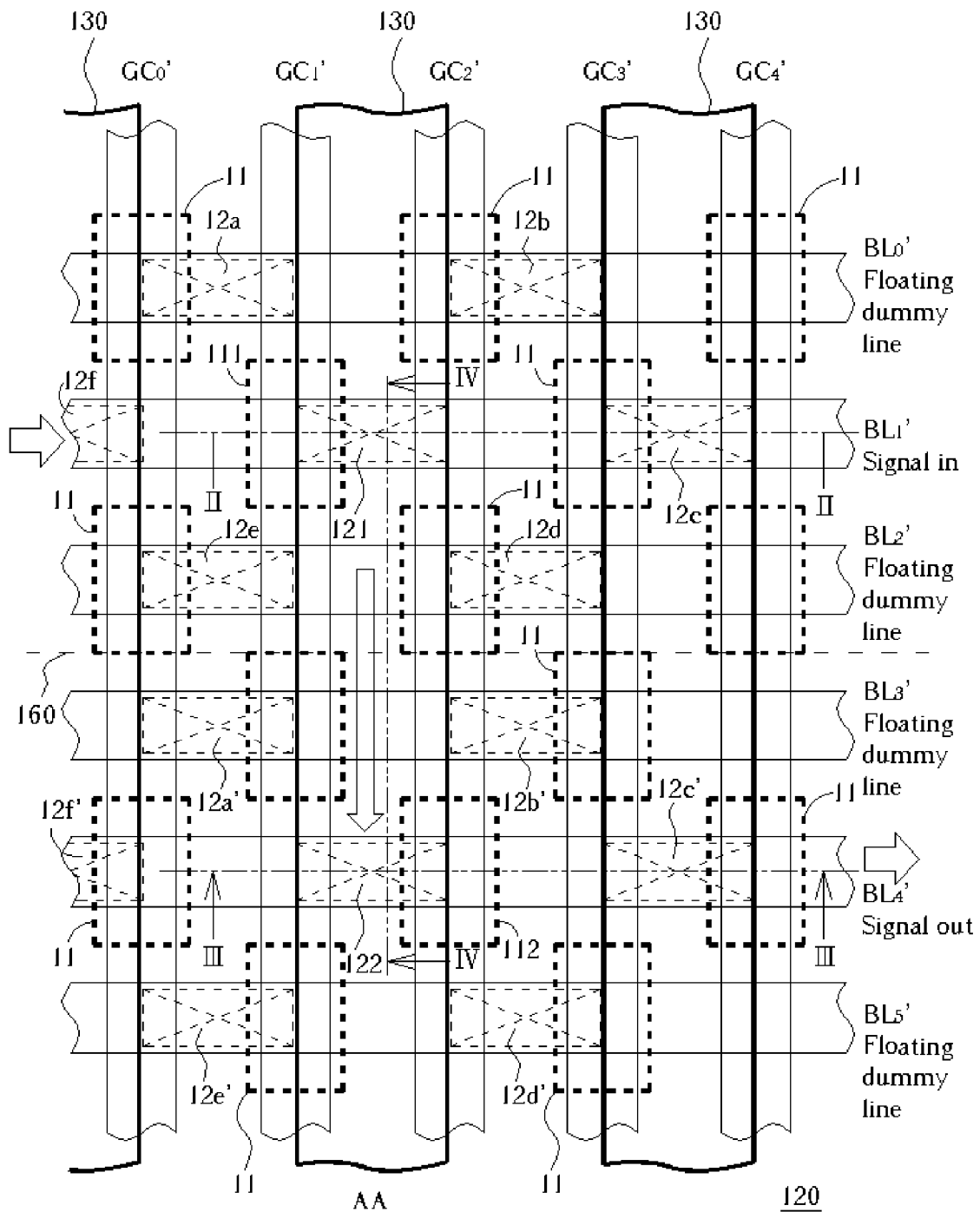
FIG. 3 is a plan view of a test key layout for monitoring GC-DT misalignment in accordance with the preferred embodiment of the present invention.
Figure 4:
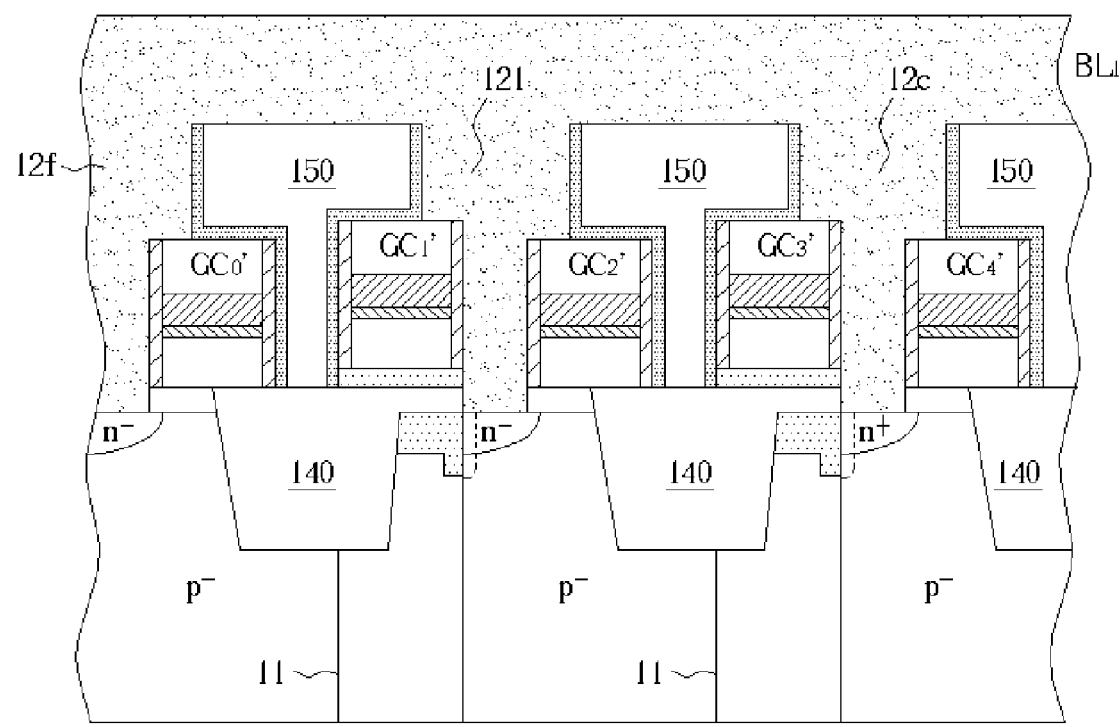
FIG. 4 is a schematic cross-sectional diagram along line II—II of FIG. 3.
Figure 5:
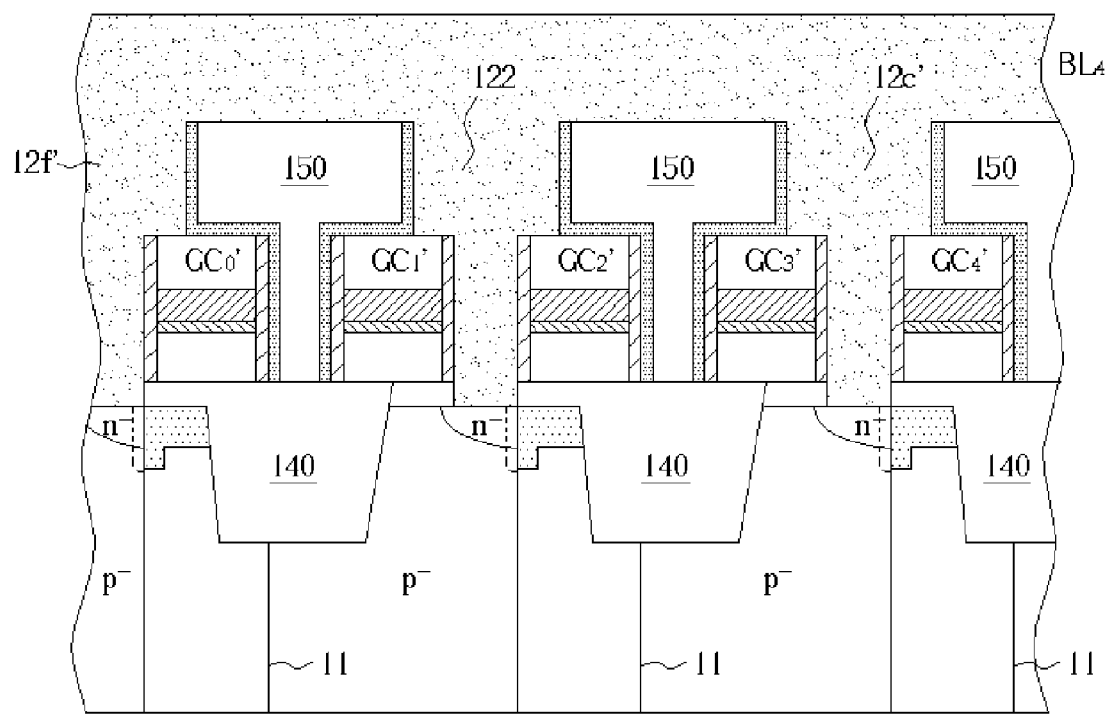
FIG. 5 is a schematic cross-sectional diagram along line III—III of FIG. 3.
Figure 6:
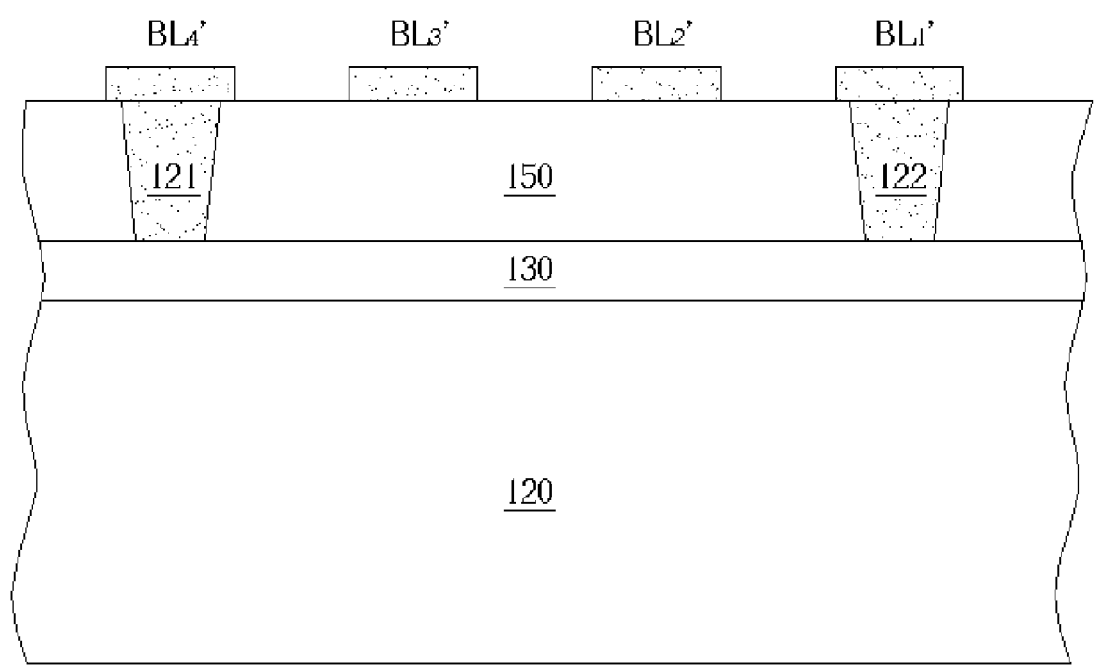
FIG. 6 is a schematic cross-sectional diagram along line IV—IV of FIG. 3.

Please refer to FIG. 3 to FIG. 6, wherein FIG. 3 is a plan view of a test key layout 100 for monitoring GC-DT misalignment in accordance with the preferred embodiment of the present invention; FIG. 4 is a schematic cross-sectional diagram along line II—II of FIG. 3; FIG. 5 is a schematic cross-sectional diagram along line III—III of FIG. 3; and FIG. 6 is a schematic cross-sectional diagram along line IV—IV of FIG. 3.

As shown in FIG. 3 to FIG. 6, the test key layout 100 comprises a plurality of deep trench capacitor structures 11, 111, 112 arranged in an interlacing matrix manner. The deep trench capacitor structures 11, 111, 112 of the test key are fabricated simultaneously with the deep trench capacitors 11 fabricated within the memory array and have the same dimensions. The deep trench capacitor structures 11, 111, 112 are formed within a substrate 120. After the formation of the deep trench capacitor structures 11, 111, 112, a conventional shallow trench isolation (STI) process is carried out to define active areas 130 and STI regions 140. Columns of gate conductor (GC) lines $GC_0'$, $GC_1'$, $GC_2'$, $GC_3'$, $GC_4'$ are patterned on the substrate 120. It is noted that the structure and line width of the GC lines $GC_0'$, $GC_1'$, $GC_2'$, $GC_3'$, $GC_4'$ of the test key are the same as the GC lines $GC_0$, $GC_1$, $GC_2$, $GC_3$, $GC_4$ of the memory array 10. The structure of the GC lines may include metal gates and polysilicon/silicide/silicon nitride stack gates, but not limited thereto.

A dielectric layer 150 is then deposited on the substrate 120. The dielectric layer 150 may include silicon nitride liner and a borophosposilicate glass (BPSG) layer. The dielectric layer 150 fills the inter-spacing between GC lines $GC_0'$, $GC_1'$, $GC_2'$, $GC_3'$, $GC_4'$. A conventional lithographic and an etching process are performed to form bit lien contacts (CB) 12a~12e, 12a'~12e', 121 and 122 in the dielectric layer 150. The CB 12a~12e, 12a'~12e', 121 and 122 of the test key and the CB 12 of the memory array 10 are fabricated by using the same photo mask and also the same lithographic process. The present invention is characterized in that the CB 12a~12e, 12a'~12e', 121 and 122 of the test key are symmetric arranged with respect to a mirror symmetric line 160, which is different from the arrangement of the CB 12 of the memory array 10. The CB 12 of the memory array 10 is not arranged in a symmetric manner.

In accordance with the preferred embodiment, the CB 12a~12e of the test key encircle the CB 121, while the CB 12a'~12e' of the test key encircle the CB 122. It is noteworthy that the CB 12a~12e and 12a'~12e' of the test key are dummy contact patterns, which are used to simulate an exposure environment around the CB 121 and 122 that is similar to the contact in the memory array 10. Accordingly, the CB 12a~12e and 12a'~12e' may be referred to as "assistant" contact patterns. In accordance with the preferred embodiment of the present invention, as shown in FIG. 3, the CB 121 of the test key layout 100 is situated on the right side of the DT structure 111, while the CB 122 is situated on the left side of the DT structure 112. The active area (AA) 130 is parallel to the GC lines and is defined between two GC lines. In a "normal" structure in the memory array, the AA is normal to the GC lines.

Referring briefly back to FIG. 1, the assistant CB 12e and 12a' are close to each other, same as the CB 12d and 12b'. The assistant CB 12e and 12a' may be connected to each other after performing a lithographic process due to the so-called optical proximity effect, same as the CB 12d and 12b'. However, this does not affect the functionality of the test key since the assistant CB 12a~12e and 12a'~12e' are dummy patterns.

Referring to FIG. 3, rows of bit lines $BL_0'$, $BL_1'$, $BL_2'$, $BL_3'$, $BL_4'$, $BL_5'$ are patterned on the dielectric layer 150. The bit lines $BL_0'$, $BL_1'$, $BL_2'$, $BL_3'$, $BL_4'$, $BL_5'$ are orthogonal to the underlying columns of GC lines $GC_0'$, $GC_1'$, $GC_2'$, $GC_3'$, $GC_4'$. $BL_0'$ is electrically connected to CB 12a and 12b. $BL_1'$ is electrically connected to CB 12c, 12f and 121. $BL_2'$ is electrically connected to CB 12d and 12e. $BL_3'$ is electrically connected to CB 12a' and 12b'. $BL_4'$ is electrically connected to CB 12c', 12f' and 122. $BL_5'$ is electrically connected to CB 12d' and 12e'. It is noted that $BL_0'$, $BL_2'$, $BL_3'$, $BL_5'$ are dummy bit lines and are floating in operation.

In accordance with the preferred embodiment of the present invention, the bit lines $BL_1'$ and $BL_4'$ are signal-in bit line and signal-out bit line, respectively. In operation, a testing signal enters the bit lines $BL_1'$ (signal-in), passing the contact CB 121, active area 130, CB 122, and transmitting to the bit lines $BL_4'$ (signal-out). By reading and detecting the resistance data of the CB 121 and 122, the GC-DT misalignment of the memory can be assessed.

Those skilled in the art will readily observe that numerous modification and alterations of the invention may be made while retaining the teachings of the invention. Accordingly, the above disclosure should be construed as limited only by the metes and bounds of the appended claims.

What is claimed is:

1. A test key structure for monitoring Gate Conductor-to-Deep Trench capacitor (GC-DT) misalignment, comprising:
   a substrate;
   a plurality of trench capacitors embedded in the substrate in an interlacing matrix manner;
   columns of gate conductor (GC) lines defined on the substrate and passing over the trench capacitors;
   a first bit line contact, surrounded by first assistant bit line contacts, wherein the first bit line contact is disposed on a right side of a first trench capacitor;
   a second bit line contact surrounded by second assistant bit line contacts, wherein the second bit line contact is disposed on a left side of a second deep trench capacitor;
   an active area situated in the substrate and the active area being electrically connected to the first and second bit line contacts; and
   rows of bit lines including a signal-in bit line connected to the first bit line contact, a signal-out bit line connected to the second bit line contact, and a plurality of floating dummy bit lines overlying the corresponding first and second assistant bit line contacts.

2. The test key structure for monitoring GC-DT misalignment according to claim 1 wherein each of the trench capacitors comprises a single side buried strap (SSBS).

3. The test key structure for monitoring GC-DT misalignment according to claim 1 wherein each of the GC lines comprises a silicon nitride cap layer.

4. The test key structure for monitoring GC-DT misalignment according to claim 1 wherein the rows of the bit lines are patterned on a dielectric layer.

5. The test key structure for monitoring GC-DT misalignment according to claim 1 wherein the test key structure has a mirror symmetric line such that the first assistant bit line contacts and the second assistant bit line contacts are symmetric with respect to the mirror symmetric line, while the plurality of trench capacitors are asymmetric with respect to the mirror symmetric line.

6. The test key structure for monitoring GC-DT misalignment according to claim 1 wherein the active area is in parallel with the bit lines.

7. The test key structure for monitoring GC-DT misalignment according to claim 1 wherein two floating dummy bit lines are interposed between the signal-in bit line and the signal-out bit line.

* * * * *